United States Patent
Lendaro

(10) Patent No.: US 7,528,671 B2
(45) Date of Patent: May 5, 2009

(54) TIMING GENERATOR

(75) Inventor: Jeffery Basil Lendaro, Noblesville, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 350 days.

(21) Appl. No.: 10/564,940

(22) PCT Filed: Jul. 7, 2004

(86) PCT No.: PCT/US2004/021545

§ 371 (c)(1),
(2), (4) Date: Jan. 17, 2006

(87) PCT Pub. No.: WO2005/013604

PCT Pub. Date: Feb. 10, 2005

(65) Prior Publication Data

US 2006/0232352 A1    Oct. 19, 2006

Related U.S. Application Data

(60) Provisional application No. 60/490,573, filed on Jul. 28, 2003.

(51) Int. Cl.
*H04N 5/12* (2006.01)
(52) U.S. Cl. ............ 331/145; 348/521; 348/546
(58) Field of Classification Search ........ 348/521, 348/546; 331/145
See application file for complete search history.

(56) References Cited

U.S. PATENT DOCUMENTS

| | | | |
|---|---|---|---|
| 3,006,995 A | 10/1961 | Fathauer | |
| 3,435,141 A | 3/1969 | Hileman et al. | |
| 3,532,810 A | 10/1970 | Steinberg | |
| 5,347,317 A | 9/1994 | Sakurai | |
| 5,502,502 A | 3/1996 | Gaskill et al. | |
| 7,307,481 B1 * | 12/2007 | Bell et al. | ........ 331/49 |

OTHER PUBLICATIONS

Search Report dated Nov. 11, 2004.

* cited by examiner

*Primary Examiner*—Joseph Chang
(74) *Attorney, Agent, or Firm*—Robert D. Shedd

(57) ABSTRACT

A timing generator and method of developing drive signals which, when input sync signals are present, delivers the leading and trailing edges of the input pulses directly to a drive output and which generates a free-running signal when input sync pulses are not present.

17 Claims, 9 Drawing Sheets

MONOSTABLE 110 TRUTH TABLE

| Inputs | | Outputs | |
|---|---|---|---|
| Ā | B̄ | Q | Q̄ |
| 1 | X | 0 | 1 |
| 1 | X | 0 | 1 |
| 0 | ↑ | ⎍ | ⎑ |
| ↓ | 1 | ⎍ | ⎑ |

MONOSTABLE 120 TRUTH TABLE

| Inputs | | | Outputs | |
|---|---|---|---|---|
| A | B | R̄ | Q | Q̄ |
| 1 | X | 1 | 0 | 1 |
| 1 | X | 1 | 0 | 1 |
| 0 | ↓ | 1 | ⎍ | ⎑ |
| ↑ | 1 | 1 | ⎍ | ⎑ |
| X | X | 0 | 0 | 1 |

X = Don't care
↓ = 1 to 0
↑ = 0 to 1

FIGURE 3

TIMING GENERATOR

This application claims the benefit, under 35 U.S.C. § 365 of International Application PCT/US04/21545, filed Jul. 7, 2004, which was published in accordance with PCT Article 21(2) on Feb. 10, 2005 in English and which claims the benefit of U.S. provisional patent application No. 60/490,573, filed Jul. 28, 2003.

FIELD OF THE INVENTION

This invention relates to the field of providing drive signals in television devices.

BACKGROUND OF THE INVENTION

In television signal processing it is often required that a horizontal time base signal be provided to various receiver functions in the absence of a horizontal drive signal. Horizontal drive is defined as a horizontal time base signal that is continuous during the vertical interval, unlike horizontal sync which-is blanked during the vertical interval. When a video signal is received, it is necessary to generate a horizontal drive signal which is synchronized to the received horizontal sync. When a signal is not received it is necessary to provide a horizontal time base signal that is fairly close in frequency and pulse width to horizontal drive. In the past this function of generating the horizontal time base signal has been done using either a phase locked loop or a synchronized oscillator. Each of these approaches can satisfy the objectives of providing a synchronized horizontal drive signal when a video input is received and a free-running horizontal time base signal otherwise; however, each has significant negative attributes. The phase locked loop suffers due to its cost and complexity as well as its potential phase jitter. Synchronized oscillators, usually either blocking oscillators or synchronized astable multivibrators, both suffer from the problem that when they are synchronized to horizontal sync, the output horizontal time base signal pulse width is determined by the oscillator components rather than the incoming horizontal sync. Due to this characteristic, events relying on the horizontal drive pulse width may vary as a function of temperature and component aging. A further problem with both the phase locked loop and synchronized oscillator approaches is that the output horizontal time base signal does not contain the equalizing pulses of the received horizontal sync signal.

The present invention provides a circuit and a method for providing a horizontal time base signal that approximates horizontal drive when no video signal is present and when horizontal sync is absent during the vertical interval of a received video signal. This invention also provides a pass-through of the incoming horizontal sync during the times when said horizontal sync is present, thus eliminating timing and pulse width uncertainties.

SUMMARY OF THE INVENTION

One embodiment of the invention is an apparatus for generating drive signals. The apparatus comprises an input for receiving a sync signal, the sync signal comprising a first interval containing one or more of a first type of timing pulses and an interval during which the first type of timing pulses are not present, and a means for generating an output drive signal. The drive signal contains one or more of a second type of timing pulses, these timing pulses being substantially coincident with the leading and trailing edges of the first type of timing pulses during the first interval and being lower in frequency and shorter in pulse width during the second interval. The sync signal may be horizontal sync and the drive signal may be horizontal drive. Further, the horizontal sync and horizontal drive signals may be NTSC (National Television Standards Committee) signals. The apparatus may comprise a plurality of monostable multivibrators disposed between the input and output, these monostable multivibrators being configured in a ring arrangement having an output of a first monostable multivibrator connected to an input of a second monostable multivibrator and an output of the second monostable multivibrator connected to a first input of the first monostable multivibrator, and wherein the input sync signal is connected to a second input of the first monostable multivibrator and the output drive signal is derived at an output of the first monostable multivibrator. The first input to the first monostable multivibrator is a reset input. In this embodiment the second monostable multivibrator exhibits a predetermined pulse duration that is less than the pulse width of the input sync signal and the sum of the pulse widths of the first and second monostable multivibrators is greater than the period of the input sync signal. At least one of the plurality of monostable multivibrators is of a retriggerable variety.

Another embodiment is a method for generating drive signals comprising the steps of examining a sync signal for the presence of one or more of a first type of pulses, outputting these first type of pulses as drive pulses if the first type of pulses are present and enabling a free-running oscillator to output one or more of a second type of pulses if the first type of pulses are not present.

Yet another embodiment of the invention is a means for generating a drive signal comprising an oscillator for generating a drive signal when no input sync signal is present, means for transmitting sync pulses from the input sync signal to the drive signal when the sync pulses are present and means for disabling the oscillator when the sync pulses are present.

BRIEF DESCRIPTION OF THE DRAWINGS

In the drawings, wherein like reference designators in more than one figure indicate the same or similar features:

FIG. 3 shows truth tables of the two monostables in FIG. 2.

DETAILED DESCRIPTION OF THE PREFERRED EMBODIMENT

Figure 1:
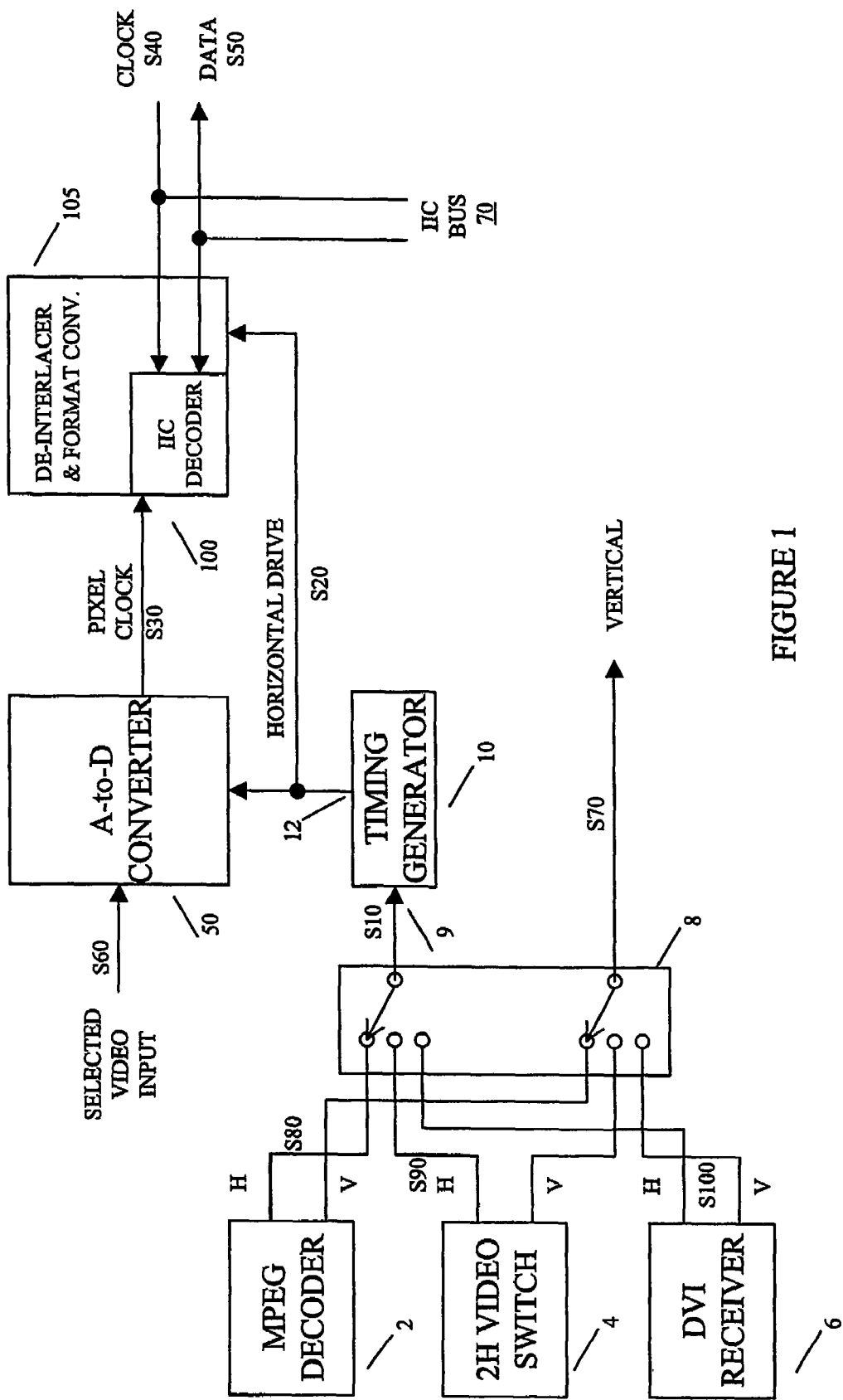
FIG. 1 is a block diagram of a portion of a television receiver embodying the present invention.

The characteristics and advantages of the present invention will become more apparent from the following description, given by way of example. Referring first to FIG. 1, the Timing Generator 10 receives an input signal S10 from one or more sources through a selector switch 8. The output S20 of timing generator 10 is applied to the horizontal drive input of A-to-D Converter 50, wherein other clock signals are generated and the selected video input signal S60 is digitized for further processing. Receiver functions are controlled by an I²C bus 70, this bus comprising a data signal S50 and a clock signal S40. Internal I²C functions may be controlled by the pixel clock S30, which is in turn generated from horizontal drive S20. In the absence of horizontal drive S20, the I²C generators 100 may "lockup" in which case control of receiver functions is lost. The present invention provides a simple, cost effective solution that assures an acceptable drive signal is always present at the horizontal drive input to A-to-D Converter 50.

The preferred embodiment of the present invention utilizes two monostable multivibrators, often called one-shot multivibrators, one-shots or simply monostables. Monostables are circuits having one stable and one quasi-stable state that can be triggered to change to the quasi-stable state, but which will return to the stable state after a predetermined time interval. This predetermined time interval is typically determined by the values of an RC timing circuit. A retriggerable monostable is a particular type of monostable device wherein the predetermined time interval is re-initiated if a trigger event occurs during the predetermined time interval that was initiated by a preceding trigger event. Another feature incorporated into some monostables is that of a reset input. Activation of a reset will cause the outputs to immediately (within a small propagation delay) assume their quiescent state. Truth tables defining the operation of the monostable multivibrators used in the preferred embodiment of the invention are shown in FIG. 3.

Figure 2:
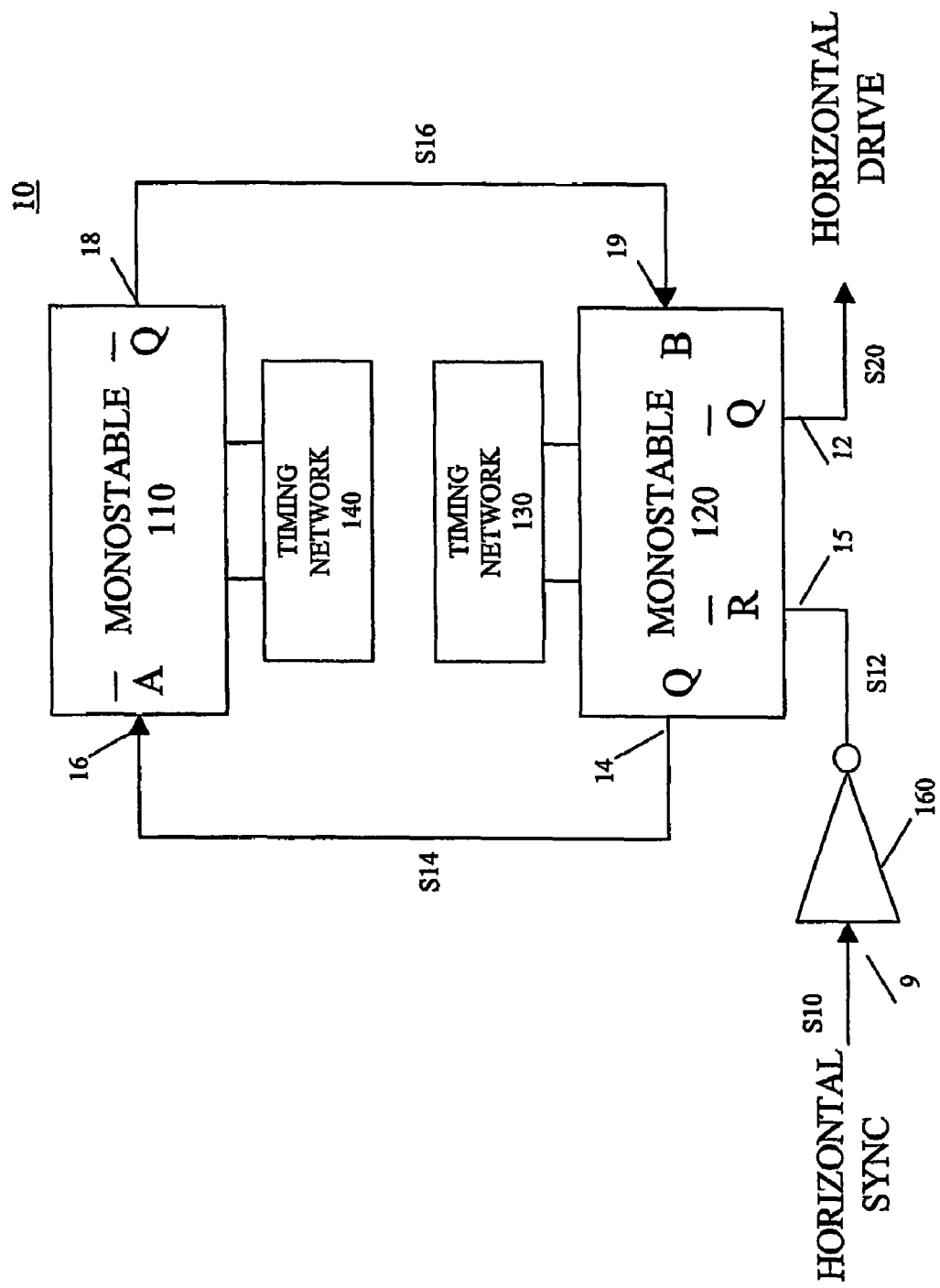
FIG. 2 is a block diagram of timing generator 10.

Referring now to FIG. 2, signal S16 from monostable 110, a retriggerable monostable, is connected to the B input 19 of monostable 120 and signal S14 is connected from the Q output 14 of monostable 120 to the (not A) input 16 of monostable 110. Monostable 120 is a retriggerable monostable having a reset capability and monostable 110 is a retriggerable monostable not requiring a reset capability. The signal S12 input to monostable 120 is an inverted, i.e, logic 0 state during horizontal sync, version of horizontal sync S10, as selected by switch 8.

As can be seen from the truth table in FIG. 3, when the (not Reset) input of monostable 120 is a logic 0, the Q output of monostable 120 is also a logic 0. When the (not Reset) input to monostable 120 is a logic 1 and the B input transitions from a logic 0 state to a logic 1 state, a logic 1 pulse is initiated at the Q output of monostable 120. When the signal at the (not A) input to monostable 110 transitions from a logic 1 state to a logic 0 state, a logic 0 pulse is initiated at the (not Q) output.

Figure 4:
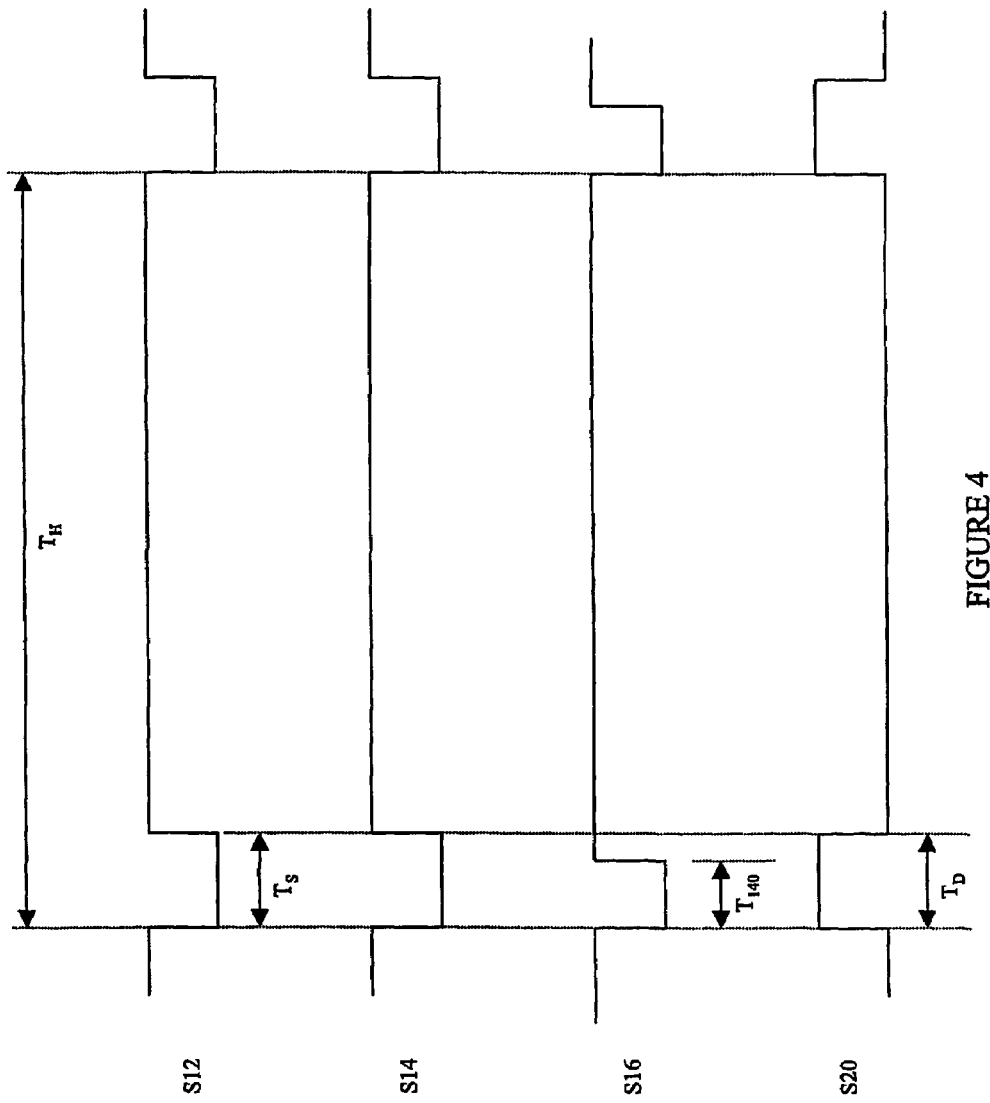
FIG. 4 is a timing diagram showing relative timing of timing generator 10 signals in the presence of a horizontal sync input.

Looking now to the timing diagram FIG. 4, if signal S12, is present and contains a logic 0 pulse during time Ts and the pulse width of monostable 110, $T_{140}$, is shorter than the width of the horizontal sync pulse, $T_S$, both the leading and trailing edges of signals S14 and S20 will be coincident with the leading and trailing edges of the input horizontal signal S12. As a consequence of signal S12 being held in a logic 0 state longer than the pulse duration $T_{140}$, horizontal drive signal S20 "follows" signal S12 (albeit in an inverted form) with only a minimal propagation delay. Typical propagation delays for the monostables used in the preferred embodiment are approximately 20 nSeconds. Even delays much greater than this would be substantially coincident if they are reasonably predictable.

Figure 5:
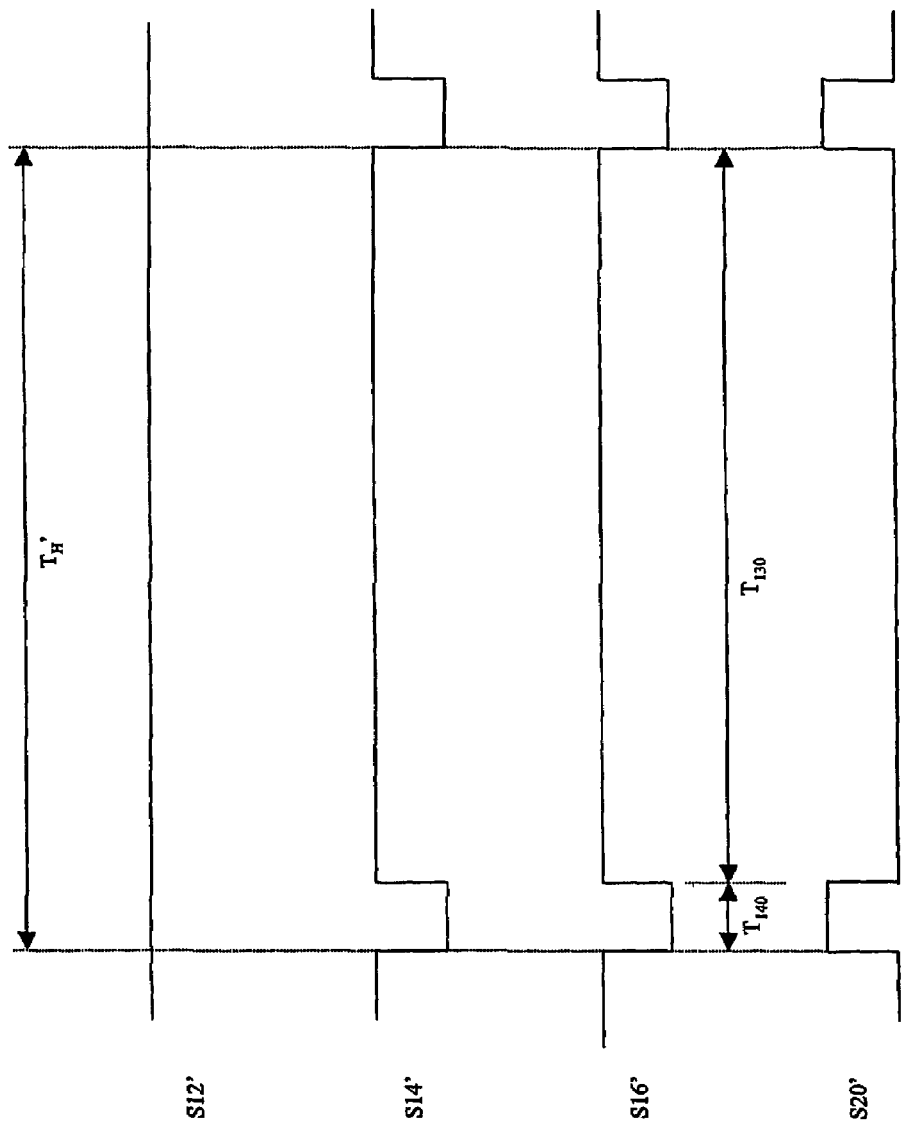
FIG. 5 is a timing diagram showing relative-timing of timing generator 10 signals in the absence of an input signal.

FIG. 5 shows the case where there are no horizontal timing pulses present at horizontal sync input. This case may occur as a result of removal of the input, as during channel change, or during the vertical interval of horizontal sync. In FIG. 5, signal S12' is a logic one, which allows the combination of monostable 110 and monostable 120 to operate as a free-running oscillator. Operation in this mode can be viewed starting when the positive-going edge of signal S16' initiates a pulse output on signal S14' from the Q output 14 of monostable 120, which is connected to the (not A) input 16 of monostable 110. A negative going edge at the (not A) input 16 of monostable 110 initiates a negative pulse on signal S16' at the (not Q) output 18 of monostable 110, the positive-going trailing edge of which reinitiates another cycle resulting in the signal S20' output waveform at the (not Q) output 12 of monostable 120 having a frequency $1/T_H'$ which is slightly lower than horizontal drive and with a pulse width $T_{140}$, which is slightly less than the pulse width $T_S$ of horizontal sync. As long as the oscillating frequency of this oscillator is lower than horizontal frequency and the pulse width is shorter than horizontal sync, when horizontal sync is reapplied, the oscillator loop will be opened and the sync generator output will be strictly a "pass-through" of the H input signal. It is this breaking of the oscillator loop and pass-through of the input signal that significantly distinguishes this invention from synchronized oscillators, the outputs from which are determined in all cases by the oscillator components; the synchronizing input only serving to synchronize the frequency of oscillation.

Figure 6:
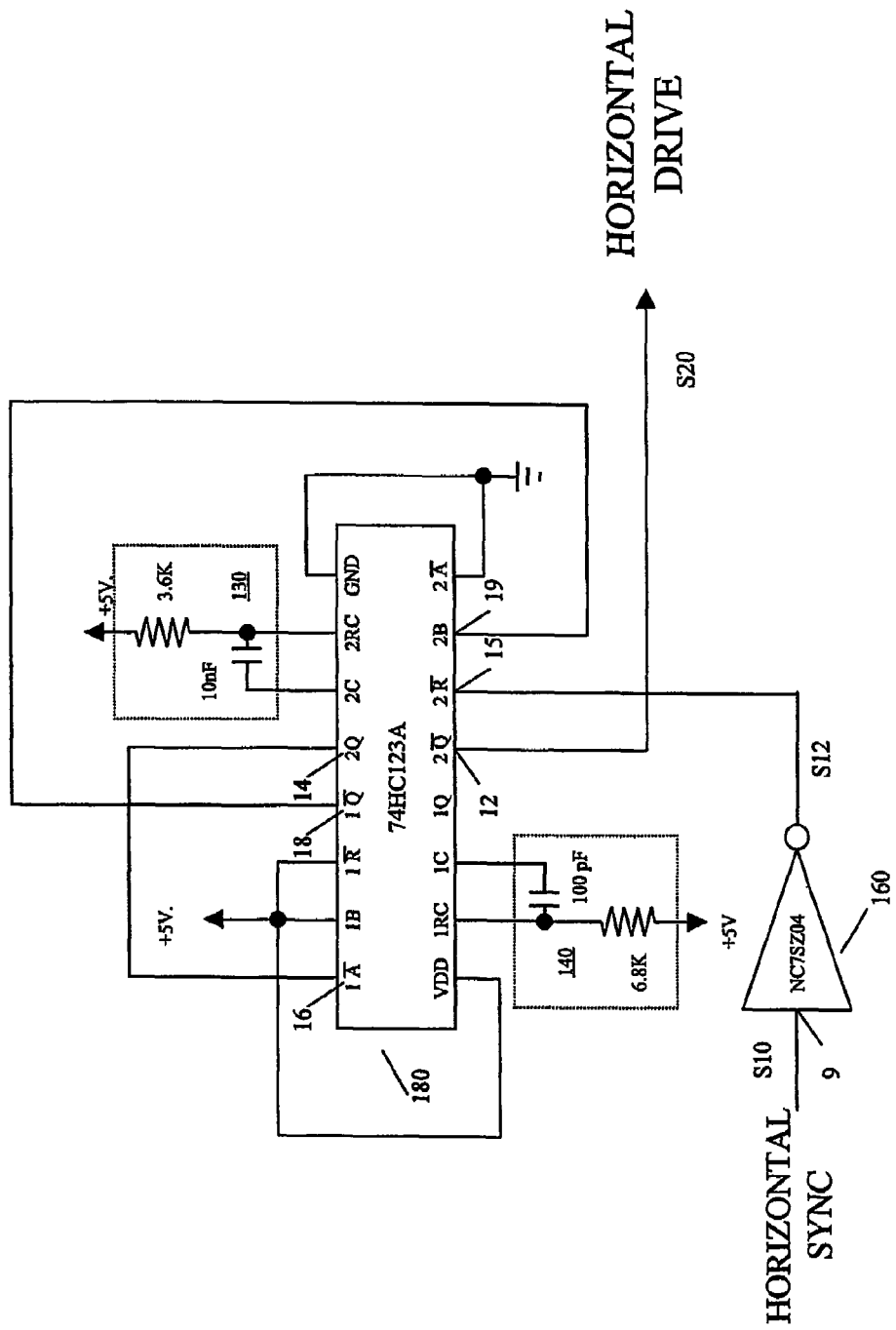
FIG. 6 is a schematic of one embodiment of the invention.

As shown in FIG. 6 it is possible to implement an embodiment of this invention using a dual retriggerable monostable with resets integrated circuit (IC) 180. One such example of such an integrated circuit is the 74HC123A which is an industry standard part manufactured by many companies. The circuit depicted in FIG. 6 includes a dual retriggerable monostable with resets IC 180, being supplied an input horizontal sync signal S10 through an inverter 160 IC, NC7SZ04. Inverted horizontal sync S12 is connected to the (not Reset) input 15 of monostable 120, contained within IC 180. The horizontal drive S20 is output from IC 180 at the (not Q) output 12 of IC 180. In this particular embodiment of the invention, the horizontal rate is twice that of normal NTSC (National Television Standards Committee) television signals, so the timing components 130 (shown in phantom), which correspond to the timing components of monostable 120, are chosen to produce a pulse width of approximately 35 micro-Seconds. Timing network 140 (shown in phantom), which corresponds to the timing components for monostable 110, are chosen to produce a pulse width of approximately 1 micro-Second. The pulse width of monostable 110, $T_{140}$, thus meets the criterion that it be less than the approximately 1.2 micro-Second duration of the horizontal sync pulse width $T_S$ in this 2H system. In general terms, the pulse width of monostable 110, $T_{140}$, must be shorter than the pulse width $T_S$ of input sync and the sum of the pulse width $T_{140}$ of monostable 110 and the pulse width $T_{130}$ of monostable 120 must be greater than the period $T_H$ of input sync.

Figure 7:
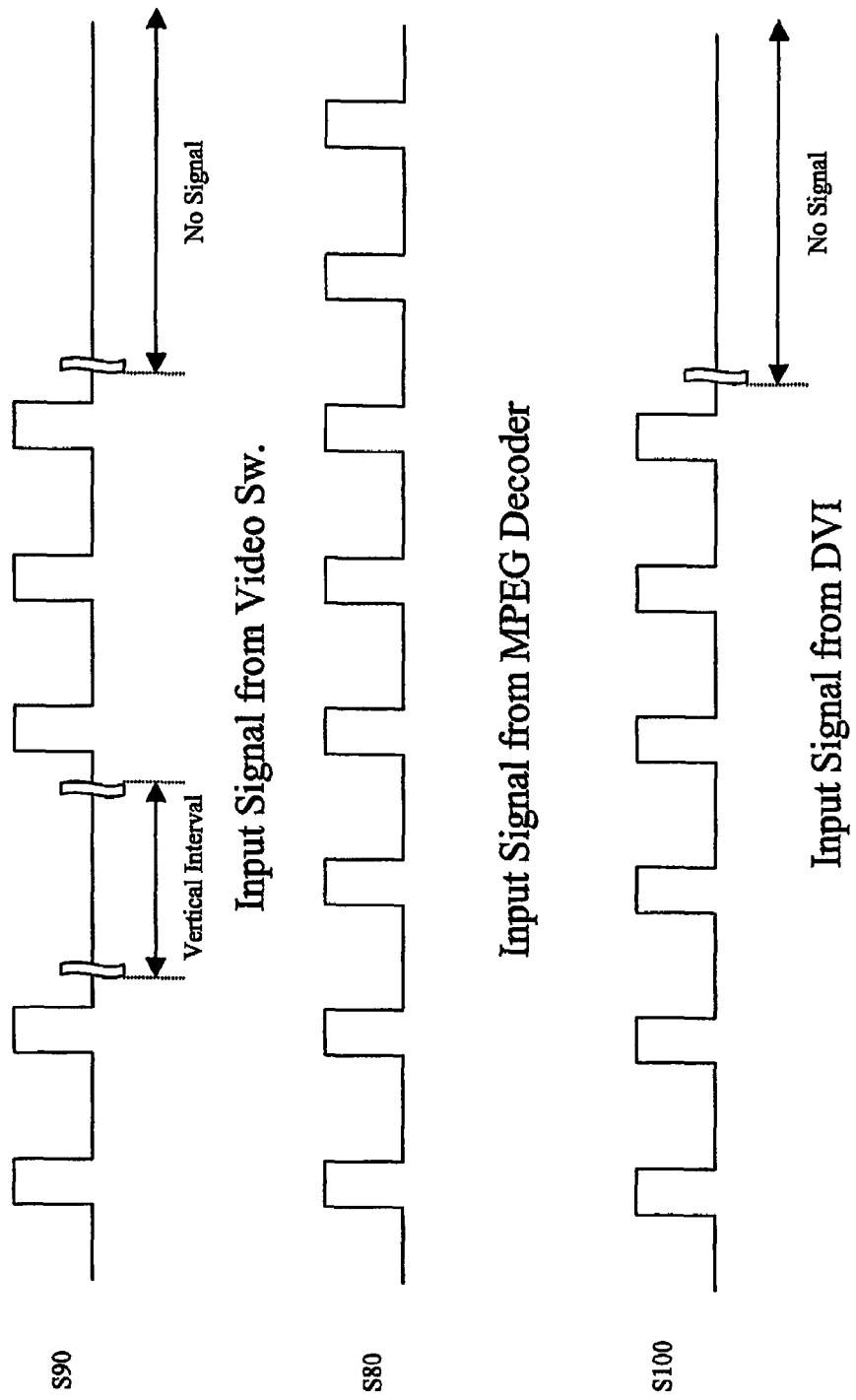
FIG. 7 shows timing diagrams of other potential input signals to timing generator 10.

FIG. 7 details various configurations of signals that may be selected by selector switch 8. Signal S90 represents the luma or Y component of a Y, Pr, Pb component input and shows that horizontal sync pulses may be absent either during the vertical interval or when no input signal is present. Signal S80 represents the case where the signal derives from an MPEG decoder and is already a horizontal drive signal and is always present when the MPEG decoder is selected by selector switch 8. Signal S100 represents a signal from a Digital Video Interface (DVI) source, which itself provides horizontal drive, i.e., it has no interruption of horizontal sync during vertical interval, but may be subject to a no-drive condition when the input signal is removed.

Figure 8:
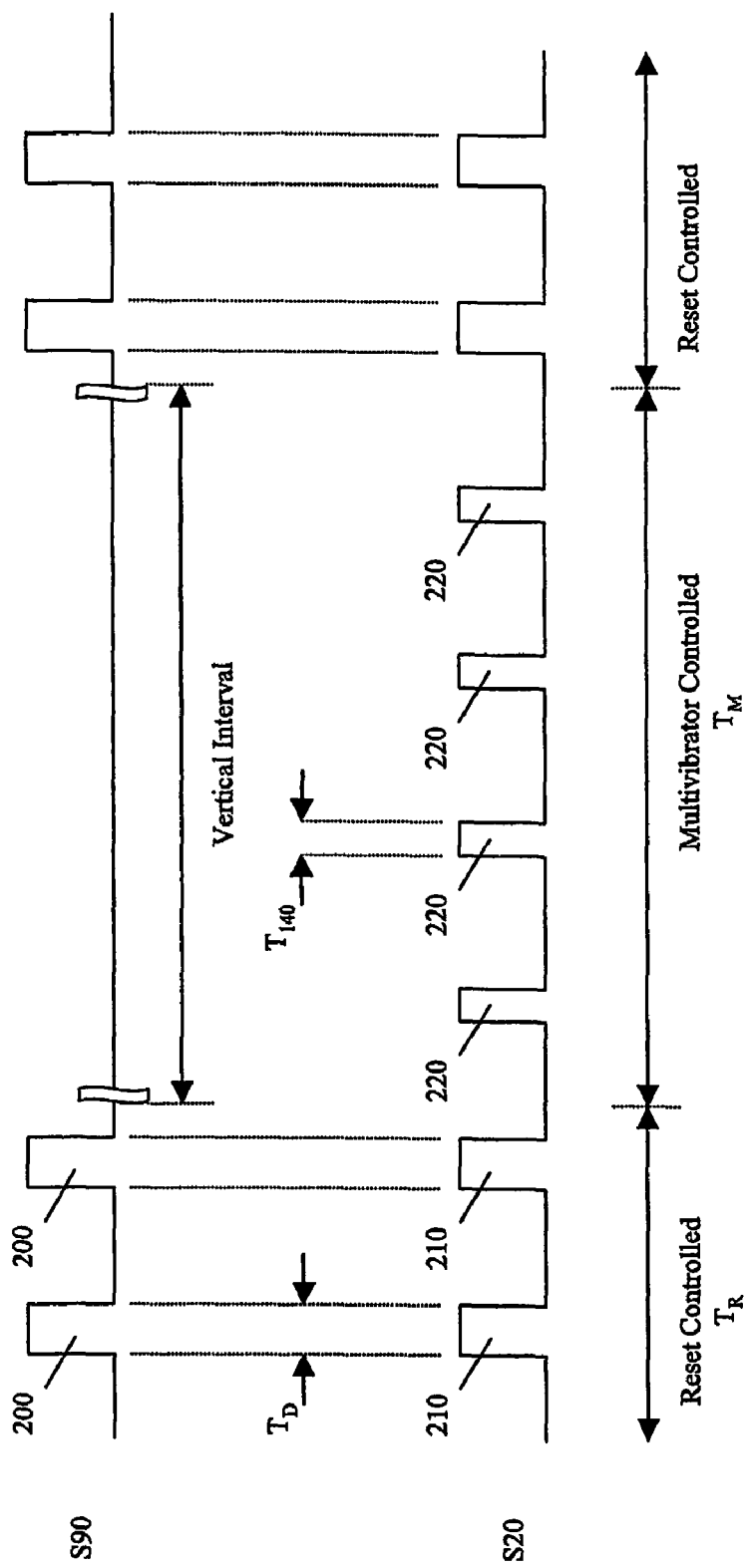
FIG. 8 is a timing diagram showing an expanded interval of horizontal sync as it occurs during vertical interval and the corresponding timing generator output for the case wherein selector switch 8 has connected signal S90 to timing generator input 9.

FIG. 8 shows an expanded view of signal S90 during the vertical interval and the characteristic of signal S20 of providing a pass-through of horizontal sync when it is present in signal S90 during the reset controlled interval $T_R$ and the multivibrator controlled, free-running oscillator interval $T_M$ during the vertical interval of signal S90.

Figure 9:
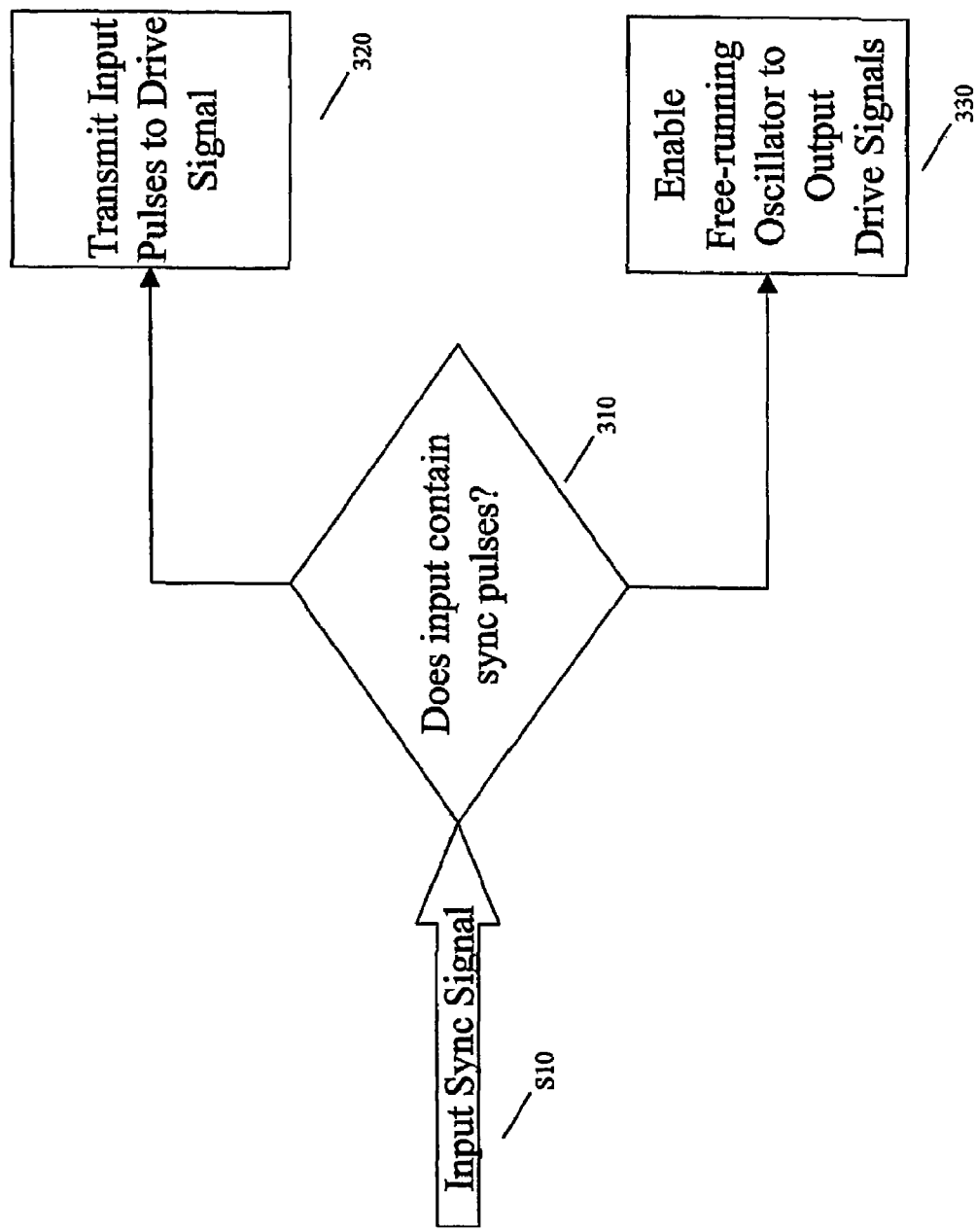
FIG. 9 shows a flow chart of a method for developing a drive signal corresponding to the present invention.

FIG. 9 is a flow diagram of an embodiment of the invention. The method comprises the steps of examining, in decision block 310, an input sync signal S10 to determine if sync pulses are present and either transmitting the input sync pulses directly to the output drive signal in action block 320 or enabling a free-running oscillator to output drive signals in action block 330.

While the present invention has been described with reference to the preferred embodiments, it should be realized that various changes may be made in the embodiments without departing from the spirit and the scope of the invention, as defined by the appended claims.

The invention claimed is:

1. An apparatus for generating drive signals comprising:
   an input for receiving a sync signal, said sync signal comprising a first interval containing one or more of a first type of timing pulses and a second interval during which said first type of timing pulses are not present;
   means for generating an output, said generating means providing a drive signal, said drive signal containing one or more of a second type of timing pulses wherein the leading and trailing edges of said second type of timing pulses are substantially coincident with the leading and trailing edges of said first type of timing pulses during said first interval and wherein said drive pulses are lower in frequency and shorter in pulse width during said second interval.

2. The apparatus as cited in claim 1 wherein said sync signal is horizontal sync and said drive signal is horizontal drive.

3. The apparatus as cited in claim 2 wherein said horizontal sync and said horizontal drive are NTSC signals.

4. The apparatus as cited in claim 2 wherein said horizontal sync and said horizontal drive are not NTSC signals.

5. The apparatus as cited in claim 1 further comprising:
   a plurality of monostable multivibrators disposed between said input and said output of said apparatus wherein said monostable multivibrators are configured in a ring arrangement having an output of a first monostable multivibrator connected to an input of a second monostable multivibrator and an output of said second monostable multivibrator connected to a first input of said first monostable multivibrator, and wherein said input sync signal is connected to a second input of said first monostable multivibrator and said output drive signal is derived at an output of said first monostable multivibrator.

6. The apparatus cited in claim 5 wherein;
   said first input to said first monostable multivibrator is a reset input.

7. The apparatus cited in claim 5 wherein;
   said second monostable multivibrator exhibits a predetermined pulse duration that is less than the pulse width of said input sync signal; and the sum of the pulse width of said first monostable multivibrator and the pulse width of said second monostable multivibrator is greater than the period of said input sync signal.

8. The apparatus as cited in claim 5 wherein: at least one of said plurality of monostable multivibrators is of a retriggerable variety.

9. A method for generating drive signals comprising the steps of:
   examining a sync signal for the presence of one or more sync pulses;
   outputting said one or more sync pulses as drive pulses when said sync pulses are present; and
   enabling an oscillator to output one or more drive pulses only when said sync pulses are not present.

10. The method cited in claim 9 wherein:
    the output of said free-running oscillator contains drive pulses of a shorter duration than sync pulses, and the repetition frequency of said free-running running oscillator output is lower than that of said sync pulses.

11. The method cited in claim 9 wherein:
    said sync signal is horizontal sync and said drive signal is horizontal drive.

12. The method cited in claim 11 wherein:
    said sync signal and said drive signal are NTSC signals.

13. The method cited in claim 11 wherein:
    said sync signal and said drive signal are not NTSC signals.

14. Means for generating a drive signal comprising:
    oscillator means for generating a drive signal when no input sync signal is present;
    means for transmitting sync pulses from said input sync signal to said drive signal when said sync pulses are present; and
    means for disabling said oscillator means when said sync pulses are present.

15. Means for generating a drive signal cited in claim 14 wherein:
    said input sync signal is horizontal sync and said drive signal is horizontal drive.

16. Means for generating a drive signal cited in claim 15 wherein:
    said sync signal and said drive signal are NTSC signals.

17. Means for generating a drive signal cited in claim 15 wherein:
    said sync signal and said drive signal are not NTSC signals.

* * * * *